(12) United States Patent
Jung et al.

(10) Patent No.: US 10,386,503 B2
(45) Date of Patent: Aug. 20, 2019

(54) ARRAY SUBSTRATE FOR DIGITAL X-RAY DETECTOR, DIGITAL X-RAY DETECTOR INCLUDING THE SAME, AND METHOD FOR MANUFACTURING THE SAME

(71) Applicant: LG Display Co., Ltd., Seoul (KR)

(72) Inventors: Seungyong Jung, Paju-si (KR); Hanseok Lee, Goyang-si (KR); Hyungil Na, Seoul (KR); JungJune Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/122,097

(22) Filed: Sep. 5, 2018

(65) Prior Publication Data

US 2019/0072677 A1 Mar. 7, 2019

(30) Foreign Application Priority Data

Sep. 5, 2017 (KR) .......................... 10-2017-0113022

(51) Int. Cl.
| | | |
|---|---|---|
| *G01T 1/20* | (2006.01) | |
| *G01T 1/24* | (2006.01) | |
| *H01L 27/146* | (2006.01) | |
| *H01L 27/12* | (2006.01) | |

(52) U.S. Cl.
CPC ............ *G01T 1/2018* (2013.01); *G01T 1/241* (2013.01); *H01L 27/1218* (2013.01); *H01L 27/1225* (2013.01); *H01L 27/1288* (2013.01); *H01L 27/14658* (2013.01); *H01L 27/14663* (2013.01); *H01L 27/14692* (2013.01)

(58) Field of Classification Search
CPC ... G01T 1/2018; G01T 1/241; H01L 27/1218; H01L 27/1225; H01L 27/1288; H01L 27/14658
See application file for complete search history.

(56) References Cited

U.S. PATENT DOCUMENTS

| | | | |
|---|---|---|---|
| 7,964,903 B2 | 6/2011 | Joo et al. | |
| 7,985,954 B2 | 7/2011 | Jung et al. | |
| 2013/0221230 A1 | 8/2013 | Tredwell et al. | |
| 2013/0342514 A1* | 12/2013 | Yokoyama | G09G 5/003 345/204 |
| 2014/0145252 A1* | 5/2014 | Kim | H01L 27/14658 257/292 |
| 2015/0316661 A1* | 11/2015 | Fujiyoshi | G01T 1/2018 378/62 |
| 2017/0373111 A1* | 12/2017 | Tomyo | H01L 21/3205 |

OTHER PUBLICATIONS

Extended European Search Report dated Jan. 30, 2019, in corresponding European Patent Application No. 18192692.4.

* cited by examiner

*Primary Examiner* — Mark R Gaworecki
(74) *Attorney, Agent, or Firm* — Morgan, Lewis & Bockius LLP

(57) ABSTRACT

An array substrate for a digital X-ray detector, a digital X-ray detector including the same, and a method for manufacturing the same are provided. A thin film transistor (TFT) array substrate for a digital X-ray detector includes: a base substrate, a thin film transistor over the base substrate, a lower electrode connected to the thin film transistor, a positive-intrinsic-negative (PIN) layer over the lower electrode, the PIN layer including: an N-type semiconductor layer, an intrinsic semiconductor layer, and a P-type semiconductor layer, a bias electrode over the PIN layer, and an upper electrode covering the PIN layer and the bias electrode.

18 Claims, 16 Drawing Sheets

FIG. 6A
(Related Art)
FIG. 6B
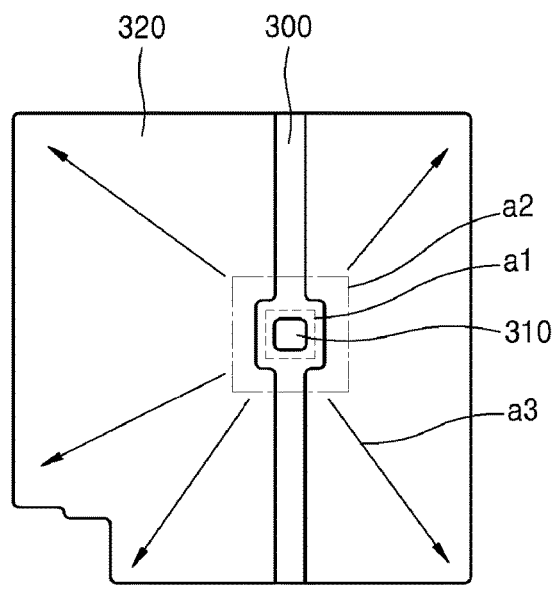
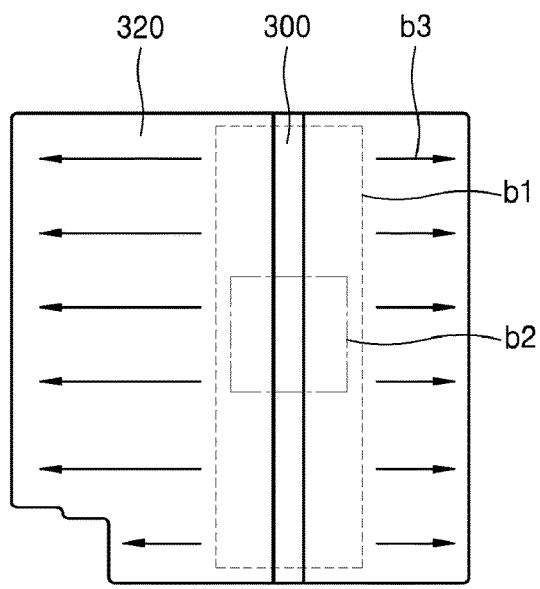

ARRAY SUBSTRATE FOR DIGITAL X-RAY DETECTOR, DIGITAL X-RAY DETECTOR INCLUDING THE SAME, AND METHOD FOR MANUFACTURING THE SAME

CROSS-REFERENCE TO RELATED APPLICATION(S)

This application claims the benefit of and priority to Korean Patent Application No. 10-2017-0113022, filed on Sep. 5, 2017, the entirety of which is hereby incorporated by reference.

BACKGROUND

1. Technical Field

The present disclosure relates to an array substrate for a digital X-ray detector, a digital X-ray detector including the same, and a method for manufacturing the same.

2. Discussion of the Related Art

With the rapid development of digital technology, a digital X-ray detector based on a thin film transistor (TFT) has recently been developed, and has rapidly come into medical use. The digital X-ray detector is an apparatus capable of detecting the transmission amount (e.g., transmissivity) of X-rays passing through a subject and displaying internal images of the subject on a display.

Generally, the digital X-ray detector may be classified into a direct digital X-ray detector for directly detecting X-rays and an indirect digital X-ray detector for indirectly detecting X-rays. The digital X-ray detector is generally designed to have several thousand or tens of thousands of pixels, or many more pixels according to the size or resolution thereof.

FIG. 1 is a cross-sectional view illustrating a single pixel in a related art indirect digital X-ray detector.

The indirect digital X-ray detector 1 may include a thin film transistor 20 over a substrate 10, a positive-intrinsic-negative (PIN) diode 30 connected to the thin film transistor 20, and a scintillator 50 over the PIN diode 30. The thin film transistor 20 includes a source 27, a drain 25, a channel region 23, and a gate region 21. When X-rays are emitted to the digital X-ray detector, the scintillator 50 converts the incident X-rays into visible light, such that the visible light is transmitted to the PIN diode 30 below the scintillator 50. The PIN diode 30 includes a lower electrode 31, a PIN layer 33, and an upper electrode 35.

The upper electrode 35 of the PIN diode 30 is connected to a bias electrode 45 through a contact hole 41 formed in a protective layer 40. The bias electrode 45 transmits a power-supply voltage to the PIN diode 30. Holes and electrons are represented as "h" and "e" in circles, respectively.

The visible light applied to the PIN diode 30 is reconverted into an electronic signal in a PIN layer 33. The electronic signal is converted into an image signal after passing through the thin film transistor 20 connected to the lower electrode 31 of the PIN diode 30, such that the resultant image signal is displayed on a display.

However, according to the related art structure, in which the upper electrode 35 of the PIN diode 30 is connected to the bias electrode 45 through the contact hole 41, contact resistance increases, such that a voltage drop or heat generation may occur. In addition, because the bias electrode is formed to have a larger size, the related art structure may cause damage in a fill factor (also called an "aperture ratio") of the pixel as large as the increased bias electrode. In addition, a bias electrode is applied only to the upper electrode 35 located in the vicinity of the contact hole 41, resulting in occurrence of an irregular voltage within the upper electrode 35.

SUMMARY

Accordingly, the present disclosure is directed to an array substrate for a digital X-ray detector, a digital X-ray detector including the same, and a method for manufacturing the same that substantially obviate one or more of the issues due to limitations and disadvantages of the related art.

An aspect of the present disclosure is to provide an array substrate for a digital X-ray detector to reduce contact resistance between a bias electrode and a positive-intrinsic-negative (PIN) diode, and a digital X-ray detector including the same.

Another aspect of the present disclosure is to provide an array substrate for a digital X-ray detector to increase an aperture ratio of a pixel portion, and a digital X-ray detector including the same.

Another aspect of the present disclosure is to provide an array substrate for a digital X-ray detector to implement a uniform voltage within an upper electrode of a PIN diode, and a digital X-ray detector including the same.

Another aspect of the present disclosure is to provide an array substrate for a digital X-ray detector to reduce the number of masks needed for overall fabrication when a bias electrode of a pad portion is capped with a metal anticorrosion layer, a digital X-ray detector including the same, and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a thin film transistor (TFT) array substrate for a digital X-ray detector, including: a base substrate, a thin film transistor over the base substrate, a lower electrode connected to the thin film transistor, a positive-intrinsic-negative (PIN) layer over the lower electrode, the PIN layer including: an N-type semiconductor layer, an intrinsic semiconductor layer, and a P-type semiconductor layer, a bias electrode over the PIN layer, and an upper electrode covering the PIN layer and the bias electrode.

In another aspect, there is provided a method for manufacturing a thin film transistor array substrate for a digital X-ray detector, the method including: providing a thin film transistor over a base substrate, providing a lower electrode connected to the thin film transistor, providing a positive-intrinsic-negative (PIN) layer over the lower electrode, the providing the PIN layer including stacking: an N-type semiconductor layer, an intrinsic semiconductor layer, and a P-type semiconductor layer, covering the thin film transistor and the PIN layer with a protective layer, the protective layer exposing an upper region of the PIN layer, providing a bias electrode over a portion of the exposed PIN layer, and covering the bias electrode and the PIN layer with an upper electrode.

In another aspect, there is provided a method for manufacturing a thin film transistor array substrate for a digital X-ray detector, the method including: providing a thin film transistor over a base substrate, providing a lower electrode connected to the thin film transistor, providing an intrinsic-negative (IN) layer over the lower electrode, the providing the IN layer including stacking: an N-type semiconductor layer, and an intrinsic semiconductor layer, covering the thin film transistor and the IN layer with a protective layer, the protective layer exposing an upper region of the IN layer, providing a P-type semiconductor layer over the exposed IN layer, providing a bias electrode over a portion of the P-type semiconductor layer, and covering the bias electrode and the P-type semiconductor layer with an upper electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

FIG. 6A is a plan view illustrating an upper electrode and a bias electrode for use in an array substrate for a digital X-ray detector according to the related art.

FIG. 6B is a plan view illustrating an upper electrode and a bias electrode for use in an array substrate for a digital X-ray detector according to an example embodiment of the present disclosure.

Figure 1:
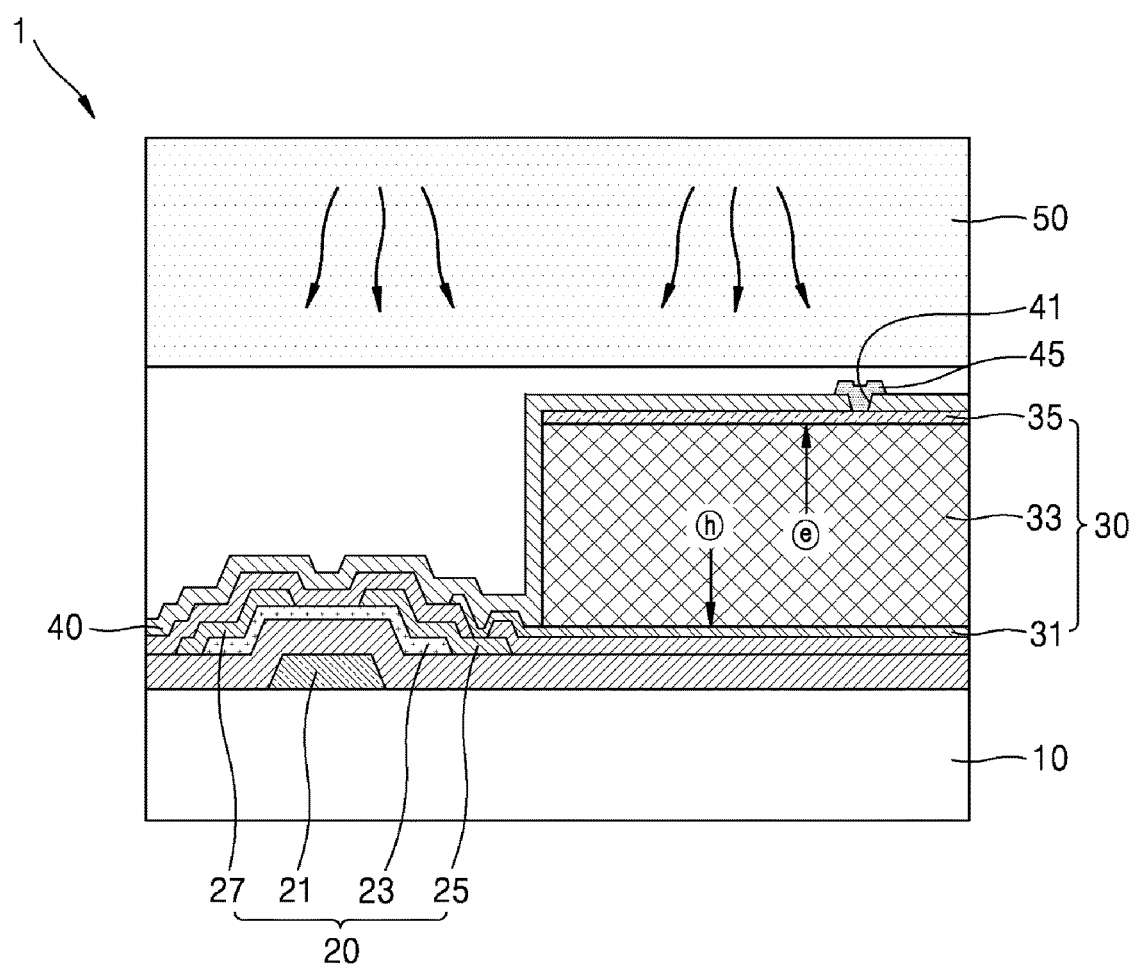
FIG. 1 is a cross-sectional view illustrating a related art digital X-ray detector.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Figure 2:
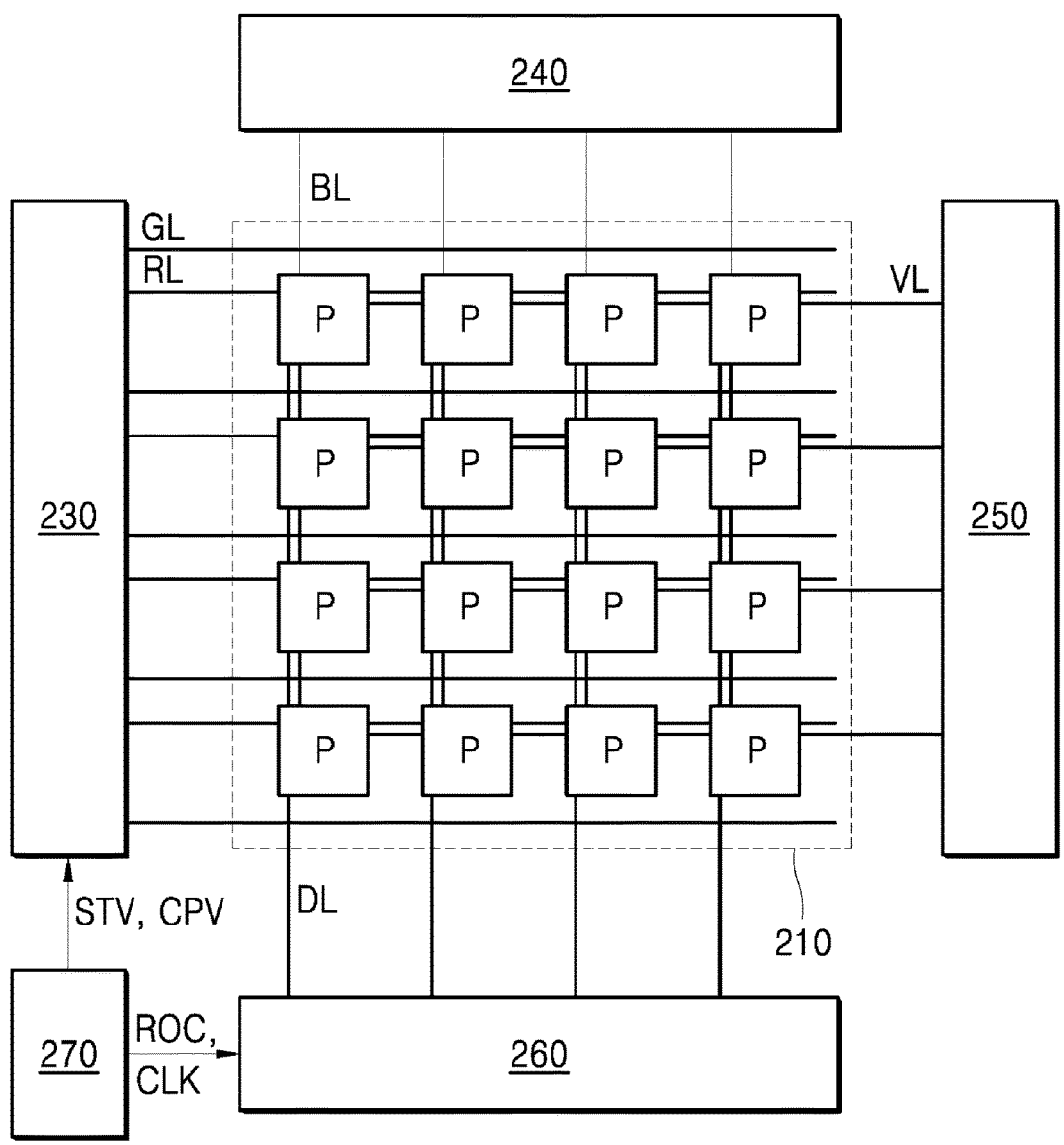
FIG. 2 is a plan view illustrating a digital X-ray detector.

FIG. 2 is a plan view illustrating a digital X-ray detector.

With reference to FIG. 2, the digital X-ray detector may include a thin film transistor (TFT) array 210, a gate driver 230, a bias supplier 240, a power-supply voltage supplier 250, a readout circuit 260, and a timing controller 270. The TFT array 210 may sense X-rays emitted from an energy source, may perform photoelectric conversion of the sensed signal, and may output an electrical detection signal. In the TFT array 210, each cell region may be defined, not only by a plurality of gate lines GL arranged in a horizontal direction, but also by a plurality of data lines DL arranged in a vertical direction perpendicular to the horizontal direction. Each cell region of the TFT array 210 may include a plurality of photosensitive pixels P arranged in a matrix.

Each photosensitive pixel P may include a positive-intrinsic-negative (PIN) diode that may sense light converted from X-rays, and may output the sensed light as a signal, and a thin film transistor (TFT) may transmit a detection signal output from the PIN diode in response to a gate signal. One side of the PIN diode may be connected to the thin film transistor (TFT), and the other side thereof may be connected to a bias line BL.

A gate electrode of the thin film transistor (TFT) may be connected to the gate line GL through which a scan signal may be transmitted, a source electrode may be connected to the PIN diode, and a drain electrode may be connected to the data line DL through which the detection signal may be transmitted. The bias line BL may be parallel to the data line DL.

The gate driver 230 may sequentially apply a plurality of gate signals, each of which having a gate-ON voltage level, through the gate lines GL. The gate driver 230 may also apply a plurality of reset signals, each of which having a gate-ON voltage level, through a plurality of reset lines RL. Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 230 may be an integrated circuit (IC), such that the gate driver 230 may be populated on an external substrate connected to the TFT array 210, or may be formed over the TFT array 210 through a gate-in-panel (GIP) process. The bias supplier 240 may apply a drive voltage through bias lines BL. The bias supplier 240 may apply a predetermined voltage to the PIN diode. For example, the bias supplier 240 may selectively apply a reverse bias or a forward bias to the PIN diode. The power-supply voltage supplier 250 may supply a power-supply voltage to the photosensitive pixels through power-supply voltage lines VL.

The readout circuit 260 may read out the detection signal generated from the thin film transistor (TFT) that is turned on in response to the gate signal. Accordingly, the detection signal generated from the PIN diode may be input to the readout circuit 260 through the data lines DL.

The readout circuit 260 may include a signal detector, a multiplexer, etc. The signal detector may include a plurality of amplification circuits corresponding to the data lines DL on a one-to one-basis, and each amplification circuit may include an amplifier, a capacitor, a reset element, etc.

To control the gate driver 230, the timing controller 270 may generate a start signal STV, a clock signal CPV, etc., and may transmit the start signal STV, the clock signal CPV, etc. to the gate driver 230. To control the readout circuit 260, the timing controller 270 may generate a readout control signal ROC, a readout clock signal CLK, etc., and may transmit the readout control signal ROC, the readout clock signal CLK, etc. to the readout circuit 260.

Figure 3:
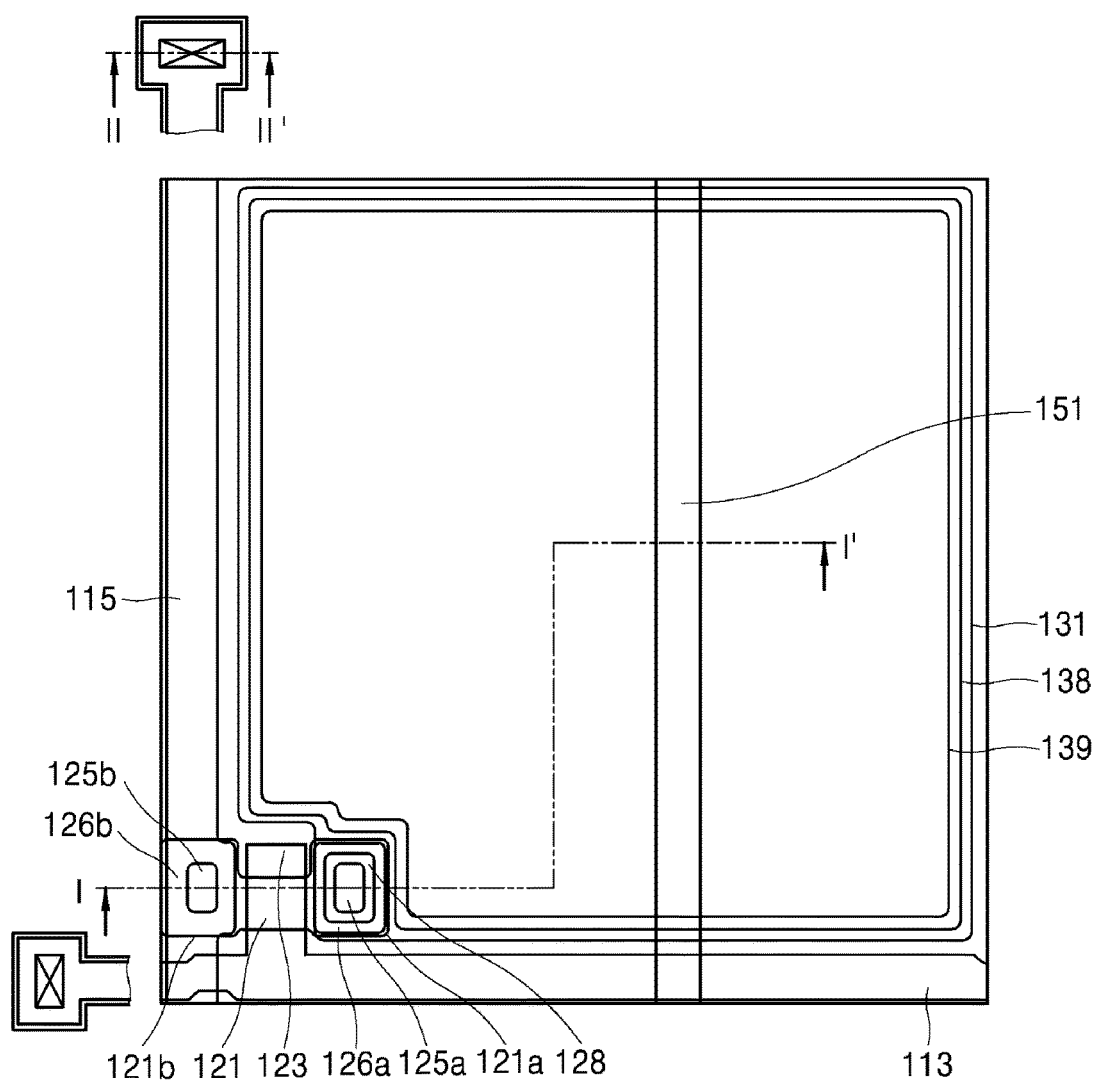
FIG. 3 is a cross-sectional view illustrating an array substrate for a digital X-ray detector according to an example embodiment of the present disclosure.
Figure 4:
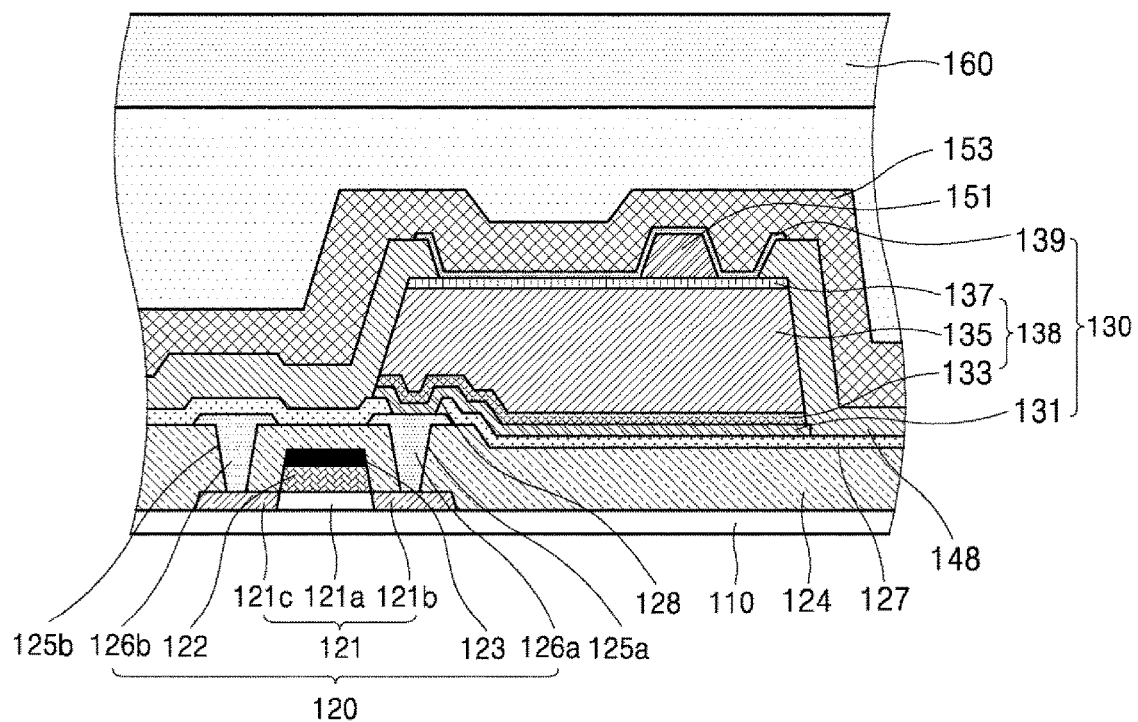
FIG. 4 is a plan view illustrating a pixel portion of an array substrate for a digital X-ray detector according to a first example embodiment of the present disclosure.

FIG. 3 is a cross-sectional view illustrating an array substrate for a digital X-ray detector according to an example embodiment of the present disclosure. FIG. 4 is a plan view illustrating a pixel portion of an array substrate for a digital X-ray detector according to a first example embodiment of the present disclosure.

An array substrate for a digital X-ray detector and the digital X-ray detector including the same, according to a first example embodiment of the present disclosure will hereinafter be described with reference to FIGS. 3 and 4. The array substrate for the digital X-ray detector according to a first example embodiment of the present disclosure may include a base substrate 110, a thin film transistor 120 over the base substrate 110, a lower electrode 131 connected to the thin film transistor 120, an N-type semiconductor layer 133 over the lower electrode 131, a PIN layer 138 including an intrinsic semiconductor layer 135 and a P-type semiconductor layer 137, a bias electrode 151 over the PIN layer 138, and an upper electrode 139 covering the PIN layer 138 and the bias electrode 151.

Pixel regions may be defined by intersection regions of the gate lines 113 arranged in one direction and the data lines 115 arranged in the other direction perpendicular to the gate lines 113. Each of the pixel regions may include a thin film transistor 120 and a PIN diode 130.

The thin film transistor 120 may be over the base substrate 110, and a buffer layer (not shown) may be between the base substrate 110 and the thin film transistor 120. The buffer layer (not shown) may be, for example, a monolayer or multilayer structure formed of, e.g., a silicon oxide ($SiO_x$) film or a silicon nitride ($SiN_x$) film.

The thin film transistor (TFT) 120 may be implemented as any one of an oxide TFT formed of indium gallium zinc oxide (IGZO), a low temperature polycrystalline silicon (LTPS) material, or an amorphous silicon thin film transistor (a-Si TFT), without being limited thereto. The thin film transistor 120 may be constructed as follows.

First, the thin film transistor 120 may include a semiconductor layer 121 formed of indium gallium zinc oxide (IGZO). For example, the semiconductor layer 121 may include a channel region 121*a* through which electrons may move, and a source region 121*b* and a drain region 121*c* may be respectively formed at both ends of the channel region 121*a*. Each of the source region 121*b* and the drain region 121*c* may be doped with impurities through doping, Foe example, each of the source and drain regions 121*b* and 121*c* may include an ohmic contact layer for reducing contact resistance regarding a first electrode 126*a* and a second electrode 126*b*. If the semiconductor layer 121 is formed of indium gallium zinc oxide (IGZO), the semiconductor layer 121 formed of IGZO may have superior electrical contact characteristics, such that formation of the ohmic contact layer may be omitted, as desired.

A gate electrode 123 extending from the gate line 113 may be over the semiconductor layer 121 (e.g., over the channel region 121*a* of the semiconductor layer 121). The gate electrode 123 may include, for example, one or more of: molybdenum (Mo), aluminum (Al), chromium (Cr), gold (Au), titanium (Ti), nickel (Ni), and copper (Cu), or may be formed of alloys thereof. The gate electrode 123 may be formed of a monolayer or multilayer structure. Embodiments are not limited to these examples.

A gate insulation layer 122 may be between the gate electrode 123 and the semiconductor layer 121. The gate electrode 122 may be formed of a monolayer or multilayer structure formed of, e.g., a silicon oxide ($SiO_x$) film or silicon nitride ($SiN_x$) film, although embodiments are not limited thereto. Portions of the semiconductor layer 121 not covered with the gate insulation layer 122 may correspond to the source and drain regions 121*b* and 121*c*.

An interlayer insulation layer (also called an "interlayer dielectric (ILD) layer") 124 may cover the semiconductor layer 121 and the gate electrode 123. The interlayer insulation layer 124 may include first contact holes 125*a* and 125*b*. For example, the first electrode 126*a* may be connected to the source region 121*b* through the first contact hole 125*a*, and the second electrode 126*b* may be connected to the drain region 121*c* through the first contact hole 125*b*. The interlayer insulation layer 124 may be formed of a monolayer or multilayer structure, e.g., formed of $SiO_x$ or $SiN_x$.

The first electrode 126*a* and the second electrode 126*b* may include, for example, one or more of: molybdenum (Mo), aluminum (Al), chromium (Cr), gold (Au), titanium (Ti), nickel (Ni), and copper (Cu), or may be formed of alloys thereof, but embodiments are not limited thereto. The first electrode 126*a* and the second electrode 126*b* may be formed of a monolayer or multilayer structure. For example, the first electrode 126*a* may be used as a source electrode, and the second electrode 126*b* may be used as a drain electrode.

The thin film transistor 120 may be implemented, not only as a top gate structured TFT as illustrated, but also as a bottom gate structured TFT. The thin film transistor 120 may be implemented as a coplanar or staggered TFT.

A first protective layer 127 may not only over the first electrode 126*a* connected to the semiconductor layer 121 through the first contact hole 125*a*, but may also over the second electrode 126*b* connected to the semiconductor layer 121 through the first contact hole 125*b*. The first protective layer 127 may be formed of a monolayer or multilayer structure formed of, e.g., a silicon oxide ($SiO_x$) film or a silicon nitride ($SiN_x$) film.

The lower electrode 131 of the PIN diode 130 may be over the first protective layer 127, such that the lower electrode 131 may be connected to the first electrode 126*a* of the thin film transistor 120 through a second contact hole 128 over the first electrode 126*a*. The lower electrode 131 may be used as a pixel electrode of the thin film transistor 120. In addition, an additional pixel electrode separated from the lower electrode 131 of the PIN diode 130 may be used, such that the first electrode 126*a* of the thin film transistor 120 and the lower electrode 131 of the PIN diode 130 may also be connected to the additional pixel electrode, as desired.

The lower electrode 131 may include a non-transparent metal material, such as molybdenum (Mo), or a transparent oxide material, such as indium tin oxide (ITO) according to characteristics of the PIN diode 130. Embodiments are not limited to these examples.

The first PIN layer 138 may be over the lower electrode 131. The PIN layer may include an N-type semiconductor layer 133 having N-type impurities, an intrinsic (I-type) semiconductor layer 135 having no impurities, and a P-type semiconductor layer 137 including P-type impurities that may be sequentially stacked.

The intrinsic (I-type) semiconductor layer 135 may have a larger thickness than the N-type semiconductor layer 133 and the P-type semiconductor 137. The PIN layer 138 may include a material capable of converting X-rays emitted from an energy source into an electric signal. For example, the first PIN layer 138 may include amorphous selenium (a-Se), mercuric iodide ($HgI_2$), cadmium telluride (CdTe), lead oxide (PbO), lead iodide ($PbI_2$), bismuth triiodide ($BiI_3$), gallium arsenide (GaAs), germanium (Ge), and the like. Embodiments are not limited to these examples.

A second protective layer 148 may cover the thin film transistor 120. For example, the second protective layer 148 may cover the first protective layer 127 and the PIN layer 138 that cover the thin film transistor 120. For example, an upper part of the PIN layer 138 may be exposed. In other words, the upper part of the PIN layer 138 corresponding to the lower electrode 131 may not be completely covered by the second protective layer 148, and the second protective layer 148 may be removed, such that the upper part of the PIN layer 138 may be exposed. The second protective layer 148 may be formed of a monolayer or multilayer structure formed of, for example, a silicon oxide ($SiO_x$) film or silicon nitride ($SiN_x$) film.

The bias electrode 151 may be over some regions of the PIN layer 138 from which the second protective layer 148 may be removed, such that the bias electrode 151 may directly contact the P-type semiconductor layer 137 of the PIN layer 138. The bias electrode 151 may be connected to the PIN diode 130 such that a bias voltage capable of controlling electrons or holes of the PIN diode 130 may be applied to the PIN diode 130. The bias electrode 151 may be formed of a non-transparent metal material, such as molybdenum (Mo) or aluminum neodymium (AlNd), although embodiments are not limited thereto.

The upper electrode 139 may cover the PIN layer 138 and the bias electrode 151. For example, the upper electrode 139 may not be covered with the second protective layer 148 and the bias electrode 151, and may contact the PIN layer 138 exposed outside, such that the upper electrode 139 may directly contact, not only the bias electrode 151, but also the P-type semiconductor layer 137 of the PIN layer 138.

The upper electrode 139 may be formed after the second protective layer 148 may be formed over the PIN layer 138, such that the second protective layer 148 may be between the PIN layer 138 and the upper electrode 139. The upper electrode 139 may be in a region corresponding to the lower electrode 131 of the PIN diode 130.

Therefore, the second protective layer 148, the bias electrode 151, and the upper electrode 139 may have some regions (or portions) over the same layer as the PIN layer 138 based on the PIN layer 138. That is, all of the second protective layer 148, the bias electrode 151, and the upper electrode 139 may have some portions that directly contact an upper surface of the PIN layer 138 (e.g., the surface of the P-type semiconductor layer 137).

For example, the upper electrode 139 may be formed of a transparent conductive material, such as indium tin oxide (ITO) or indium zinc oxide (IZO), to increase light transmission efficiency of the scintillator 160 that may receive X-rays, and may perform conversion of a wavelength of the X-rays. For example, the upper electrode 139 may not contact only some portions of the bias electrode 151 through a contact hole, and may enclose an overall line of the bias electrode 151, such that a contact region between the upper electrode 139 and the bias electrode 151 can be increased in size.

In other words, as shown in the FIG. 3 example, the upper electrode 139 may enclose the bias electrode 151 in an overall region corresponding to the upper electrode 139 and the bias electrode 151, such that the upper electrode 139 may directly contact the bias electrode 151 in the overall region along its length. In addition, the width of the bias electrode 151 may not increase in the vicinity of some regions, such as a contact hole, and the width of the bias electrode 151 may be maintained constant in all surfaces corresponding to the upper electrode 139.

The third protective layer 153 may be over the upper electrode 139, and the scintillator 160 may be over the third protective layer 153, such that the digital X-ray detector may be constructed. For example, an organic insulation layer may be over the third protective layer 153, such that the scintillator 160 may be over the organic insulation layer. If desired, the scintillator 160 may also be formed as a film, and then may be attached to the organic insulation layer. Through a separate growth process, the scintillator 160 may also be formed over the third protective layer 153. The scintillator 160 may be formed of cesium iodide, although embodiments are not limited thereto.

Figure 5:
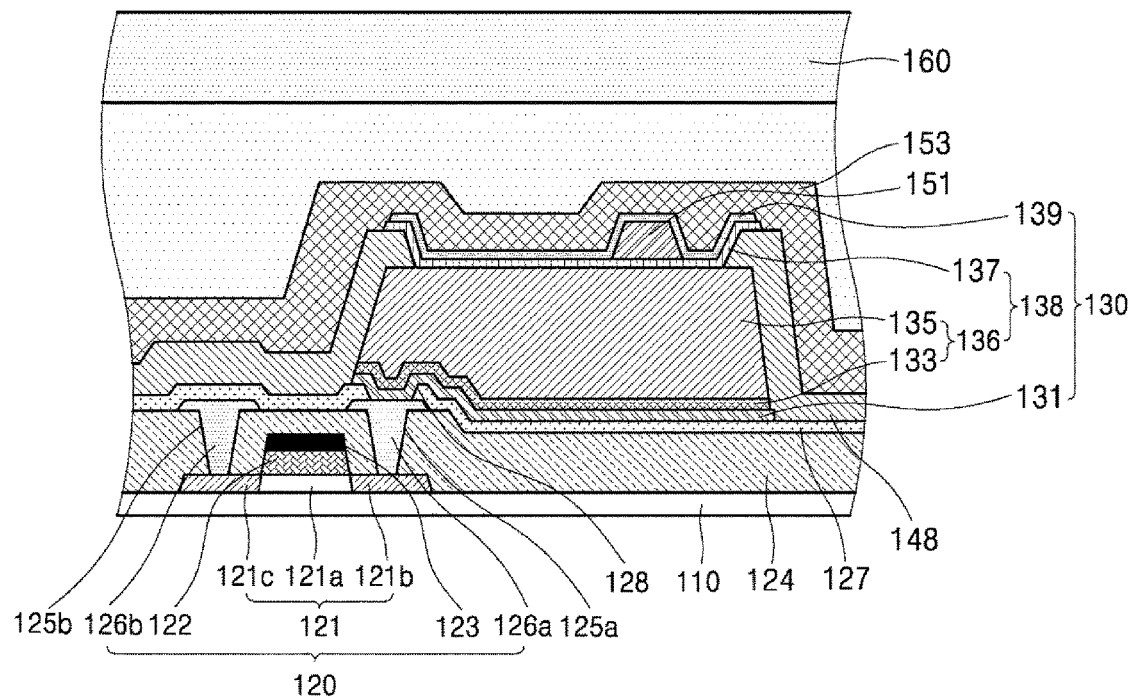
FIG. 5 is a plan view illustrating a pixel portion of an array substrate for a digital X-ray detector according to a second example embodiment of the present disclosure.

FIG. 5 is a plan view illustrating a pixel portion of an array substrate for a digital X-ray detector according to a second example embodiment of the present disclosure.

In comparison between the second example embodiment of FIG. 5 and the first example embodiment of FIG. 4, whereas the second example embodiment of FIG. 5 is similar in structure to the first example embodiment of FIG. 4, the second example embodiment of FIG. 5 is different from the first example embodiment of FIG. 4 in some aspects. For example, whereas the first example embodiment of FIG. 4 includes the second protective layer 148 between the PIN layer 138 and the upper electrode 139 (e.g., between the P-type semiconductor layer 137 of the PIN layer 138 and the upper electrode 139), the second example embodiment of FIG. 5 includes the second protective layer 148 between the intrinsic semiconductor layer 135 and the P-type semiconductor layer 137 of the PIN layer 138.

In the following description, duplicate description of the first example embodiment of FIG. 4 will be omitted for convenience of description, and the second example embodiment of FIG. 5 will be described with reference to characteristics different from those of the first example embodiment of FIG. 4.

In an array substrate for a digital X-ray detector according to the second example embodiment, an intrinsic-negative (IN) layer 136, in which the N-type semiconductor layer 133 and the intrinsic semiconductor layer 135 may be sequentially stacked, may be disposed over the lower electrode 131.

The second protective layer 148 may cover the thin film transistor 120. For example, the second protective layer 148 may cover the first protective layer 127 and the IN layer 138 that cover the thin film transistor 120. An upper part of the intrinsic semiconductor layer 135 of the IN layer 136 may be exposed. That is, the upper region of the intrinsic semiconductor layer 135 corresponding to the lower electrode 131 may not be completely covered with the second protective layer 148, and the second protective layer 148 may be removed, such that the upper region of the intrinsic semiconductor layer 135 may be exposed.

The P-type semiconductor layer 137 may directly contact the intrinsic semiconductor layer 135 at a region at which the upper part of the intrinsic semiconductor layer 135 may be exposed by removing the second protective layer 148 from the upper region of the intrinsic semiconductor layer 135, resulting in formation of the PIN layer 138. For example, the P-type semiconductor layer 137 may be at a region corresponding to the lower electrode 131.

The bias electrode 151 may be over some regions of the PIN layer 138 from which the second protective layer 148 may be removed, such that the bias electrode 151 may directly contact the P-type semiconductor layer 137 of the PIN layer 138. The bias electrode 151 may be connected to the PIN diode 130, such that a bias voltage capable of controlling electrons or holes of the PIN diode 130 may be applied to the PIN diode 130.

The upper electrode 139 may cover the P-type semiconductor layer 137 of the PIN layer 138 and the bias electrode 151. For example, the upper electrode 139 may not be covered with the bias electrode 151, and may contact the exposed PIN layer 138, such that the upper electrode 139 may directly contact both the bias electrode 151 and the P-type semiconductor layer 137 of the PIN layer 138.

The P-type semiconductor layer 137 may be formed after the second protective layer 148 is provided to the IN layer 136, such that the second protective layer 148 may be between the P-type semiconductor layer 137 and the intrinsic semiconductor layer 135 of the IN layer 136. The upper electrode 139 may be in a region corresponding to the lower electrode 131 of the PIN layer 138.

Therefore, the bias electrode 151 and the upper electrode 139 may have some regions that are over the same layer as the PIN layer 138 based on the PIN layer 138. That is, all of the bias electrode 151 and the upper electrode 139 may have some regions (or portions) that directly contact an upper surface of the PIN layer 138 (e.g., the surface of the P-type semiconductor layer 137).

The above-mentioned first and second example embodiments have common structural characteristics in that the bias electrode 151 may be over some regions of the PIN layer 138, and the upper electrode 139 may cover the bias electrode 151 and the PIN layer 138. The above-mentioned structural characteristics of the first and second example embodiments may have the following advantages and effects as compared to the related art.

FIG. 6A is a plan view illustrating an upper electrode and a bias electrode for use in an array substrate for a digital X-ray detector according to the related art. FIG. 6B is a plan view illustrating an upper electrode and a bias electrode for use in an array substrate for a digital X-ray detector according to an example embodiment of the present disclosure.

With reference to the array substrate for the conventional digital X-ray detector illustrated in the related art example of FIG. 6A, a bias electrode 300 contacts an upper electrode 320 through a contact hole 310 as shown in region a1 of FIG. 6A, resulting in occurrence of very high contact resistance. In contrast, in an example embodiment of the present disclosure illustrated in FIG. 6B, contact between a bias electrode 300 and an upper electrode 320 through a contact hole 310 may be achieved in some regions (or portions), and direct contact between the bias electrode 300 and the upper electrode 320 may be achieved in the entirety of a bias line 300 corresponding to the upper electrode 320, as shown in the region b1 of FIG. 6B, such that contact resistance can be greatly reduced. In this way, contact resistance may be reduced, such that voltage drop and heat generation can be reduced or minimized.

In the array substrate for the conventional digital X-ray detector according to the related art shown in FIG. 6A, the bias electrode 300 is connected to the upper electrode 320 through the contact hole 310, such that the bias electrode 300 may be formed to have a larger region in the vicinity of the contact hole 310, resulting in reduction of a fill factor (aperture ratio) of pixels. However, as can be seen from region b2 of the example embodiment illustrated in FIG. 6B, the bias electrode 300 may be not connected to the upper electrode 320 through a separate contact hole, and may directly contact the upper electrode 320 along a bias line, such that the bias line may have a constant width, and may not necessarily include a thick region therein. Accordingly, embodiments of the present disclosure may have an increased aperture ratio (e.g., an increased fill factor) as compared to the related art.

In the array substrate for the conventional digital X-ray detector illustrated in FIG. 6A according to the related art, a bias voltage is transmitted from the vicinity of the contact hole region 310 to the upper electrode 320, as shown in region a3 of FIG. 6A, such that a voltage within the upper electrode of the PIN diode becomes irregular. In contrast, in the array substrate for the digital X-ray detector according to an example embodiment of the present disclosure illustrated in FIG. 6B, as the bias voltage is transmitted along the overall line surface of the bias line as shown in line b3 of FIG. 6B, a voltage within the upper electrode 320 of the PIN diode may be uniformly distributed, such that a leakage current of the PIN diode may be reduced or minimized. As described above, the leakage current of the PIN diode may directly affect a throughput or performance of the digital X-ray detector, such that embodiments of the present disclosure can improve a throughput or performance of the digital X-ray detector.

The above-mentioned digital X-ray detector 100 may operate as follows. X-rays emitted to the digital X-ray detector may be converted into visible light by the scintillator 160. The visible light may be converted into an electronic signal by the PIN layer 138 of the PIN diode 130. For example, when visible light is emitted to the PIN layer 138, the intrinsic semiconductor layer 135 may be depleted by the P-type semiconductor layer 137 and the N-type semiconductor layer 133, and thus may generate an electric field therein. Electrons and holes generated by light may be drifted by the electric field, and may then be respectively collected in the P-type semiconductor layer 137 and in the N-type semiconductor layer 133.

The PIN diode 130 may convert visible light into an electronic signal, and may deliver the electronic signal to the thin film transistor 120 through a first electrode 126a acting as an electrically-connected source electrode. The delivered electronic signal may be displayed as an image signal after passing through the data line 115 connected to the second electrode 126b acting as the drain electrode of the thin film transistor 120.

A method for manufacturing the array substrate for the digital X-ray detector according to example embodiments of the present disclosure will hereinafter be described with reference to FIGS. 7A to 8E. FIGS. 7A to 7E are a cross-sectional views illustrating a process of forming an array substrate for a digital X-ray detector according to the first example embodiment of the present disclosure. FIGS. 8A to 8E are a cross-sectional views illustrating a process of forming an array substrate for a digital X-ray detector according to the second example embodiment of the present disclosure.

A method for manufacturing the array substrate for the digital X-ray detector according to the first example embodiment of the present disclosure may include providing a base substrate, providing a thin film transistor over the base substrate, providing a lower electrode connected to the thin film transistor, providing a PIN layer in which an N-type semiconductor layer, an intrinsic semiconductor layer, and a P-type semiconductor layer may be stacked, over the lower electrode, providing a protective layer to cover the thin film transistor and the PIN layer as well as to expose an upper region of the PIN layer, providing a bias electrode over some regions (e.g., a portion) of the exposed PIN layer, and providing an upper electrode to cover the bias electrode and the PIN layer.

A method for manufacturing the array substrate for the digital X-ray detector according to the second example embodiment of the present disclosure may include providing a base substrate, providing a thin film transistor over the base substrate, providing a lower electrode connected to the thin film transistor, providing an IN layer in which an N-type semiconductor layer and an intrinsic semiconductor layer may be stacked, over the lower electrode, providing a protective layer to cover the thin film transistor and the IN layer as well as to expose an upper region of the IN layer, providing a P-type semiconductor layer over the exposed IN layer, providing a bias electrode over some regions (e.g., a portion) of the P-type semiconductor layer, and providing an upper electrode to cover the bias electrode and the P-type semiconductor layer.

Figure 7A:
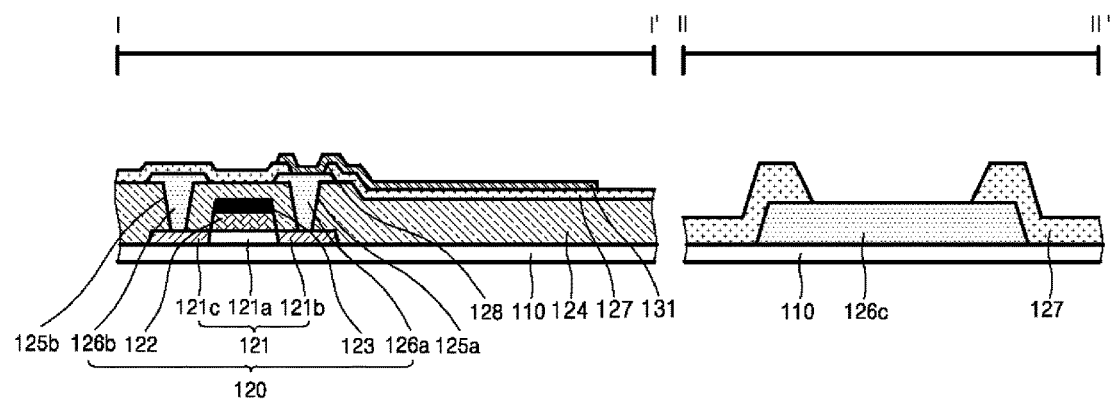
FIGS. 7A to 7E are a cross-sectional views illustrating a process of forming an array substrate for a digital X-ray detector according to the first example embodiment of the present disclosure.
Figure 8A:
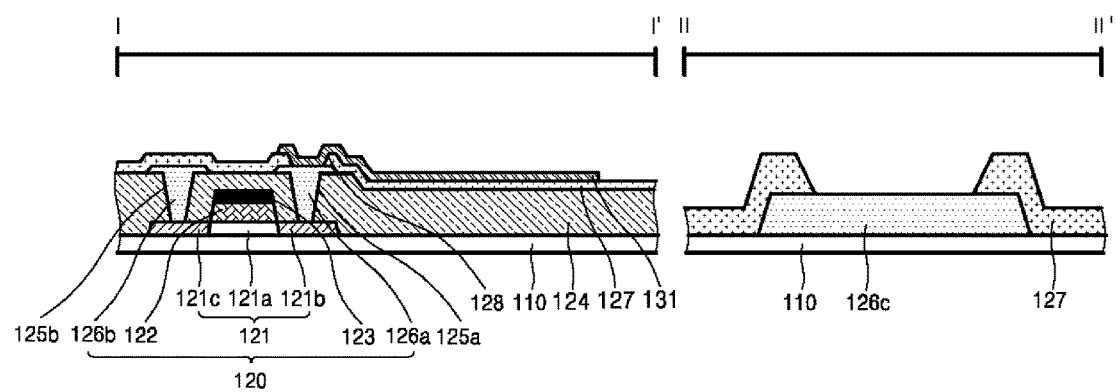
FIGS. 8A to 8E are a cross-sectional views illustrating a process of forming an array substrate for a digital X-ray detector according to the second example embodiment of the present disclosure.

The manufacturing processes commonly used in the first and second example embodiments will first be described, and different manufacturing processes for use in the first and second example embodiments will be described separately from each other. With reference to FIGS. 7A and 8A, a base substrate 110 may first be provided, and a buffer layer (not shown) may be provided over the base substrate 111 as necessary. For example, the base substrate 110 may be provided in a data pad portion, and the buffer layer may also be provided therein, as desired.

A thin film transistor 120 may be provided over the base substrate 110 of a pixel portion. For example, a semiconductor layer 121, a gate insulation layer 122, and a gate electrode 123 may be formed by a deposition and patterning process. To form a source region 121b and a drain region 121c respectively connected to a first electrode 126a and a second electrode 126b at both ends of the semiconductor layer 121, a doping layer may be formed at both ends of the semiconductor layer 121. For example, the gate electrode 123 may be provided to correspond to an upper part of a channel region 121a of the semiconductor layer 121.

Thereafter, an interlayer insulation layer (also called an "interlayer dielectric (ILD) layer") 124 may be provided to cover the gate electrode 123 and the semiconductor layer 121. For example, a first contact hole 125a may be formed over the source region 121b of the semiconductor layer 121, and a first contact hole 125b may be formed over the drain region 121c of the semiconductor layer 121, such that some regions of the semiconductor layer 121 may be exposed.

The first electrode 126a and the second electrode 126b may be formed over the interlayer insulation layer 124 by a deposition and patterning process, such that the first electrode 126a may be electrically connected to the semiconductor layer 121 through the first contact hole 125a, and the second electrode 126b may be electrically connected to the semiconductor layer 121 through the first contact hole 125b by the deposition and patterning process. For example, in the data pad portion, a pad-portion source/drain electrode 126c may be formed by the same deposition and patterning process by which the first electrode 126a and the second electrode 126b of the pixel portion may be formed. That is, the first electrode 126a, the second electrode 126b, and the pad-portion source/drain electrode 126c may be simultaneously formed by only one mask process.

Thereafter, the first protective layer 127 may be provided to cover the thin film transistor 120. In the first protective layer 127, a second contact hole 128 may be formed over a portion corresponding to the first electrode 126a, such that some portions of the first electrode 126a may be exposed.

Even in the data pad portion, the first protective layer 127 may be provided to cover the pad-portion source/drain electrode 126c, and a contact hole may be formed in a manner that an upper part of the pad-portion source/drain electrode 126c may be exposed to make contact between the pad-portion bias electrode 155 (to be provided later) and the pad-portion source/drain electrode 126c. A lower electrode 131 may be formed over the first protective layer 127 by a deposition and patterning process, such that the lower electrode 131 may be connected to the partially-exposed first electrode 126a.

Thereafter, there arises a difference in fabrication process between the first example embodiment and the second example embodiment. The first example embodiment will hereinafter be described with reference to FIGS. 7B to 7E.

Figure 7B:
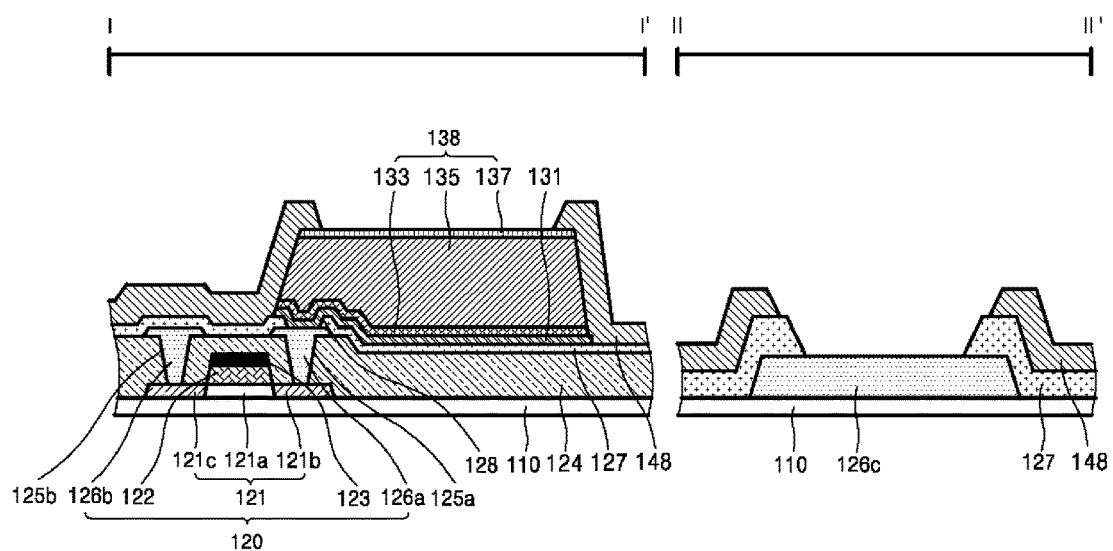

With reference to FIG. 7B, an N-type semiconductor layer 133, an intrinsic semiconductor layer 135, and a P-type semiconductor layer 137 may be sequentially stacked over the lower electrode 131, resulting in formation of a PIN layer 138. After formation of the PIN layer 138, the thin film transistor 120 and the PIN layer 138 may be covered with a second protective layer 148, and the second protective layer 148 may expose the upper region of the PIN layer 138.

For example, even in the data pad portion, the second protective layer 148 may cover the first protective layer 127, and the second protective layer 148 may expose the upper part of the pad-portion source/drain electrode 126c in a similar manner as in the first protective layer 127. The second protective layer 148 of the pixel portion and the second protective layer 148 of the data pad portion may be formed by the same mask process.

Figure 7C:
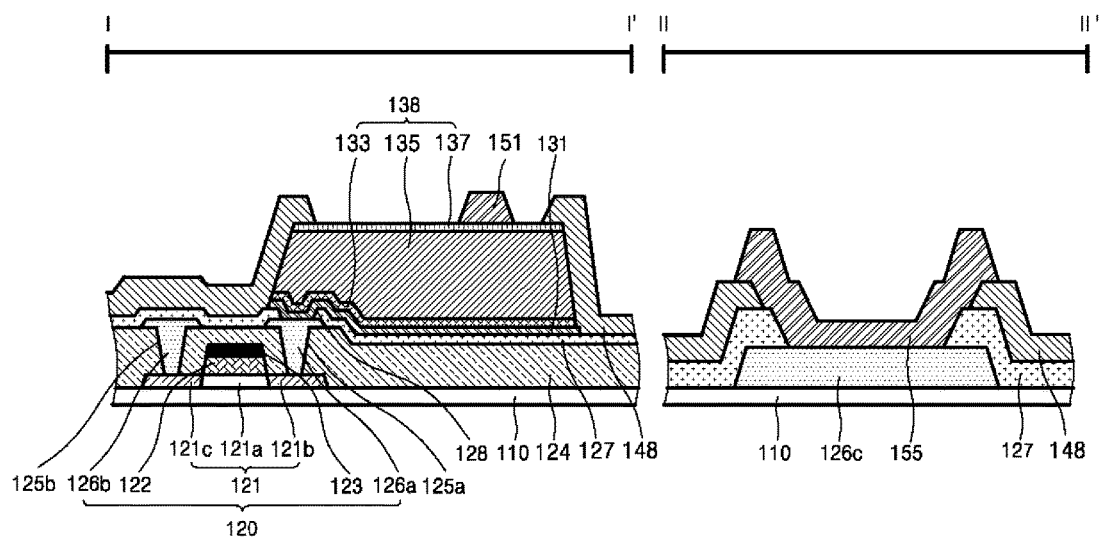

With reference to FIG. 7C, a bias electrode 151 may be provided over the PIN layer 138 (for example, over some regions (or portions) of the P-type semiconductor layer 137). For example, even in the data pad portion, the pad-portion bias electrode 155 may cover the exposed region of the pad-portion source/drain electrode 126c, and may be formed by the same mask process as in the bias electrode 151 of the pixel portion.

Figure 7D:
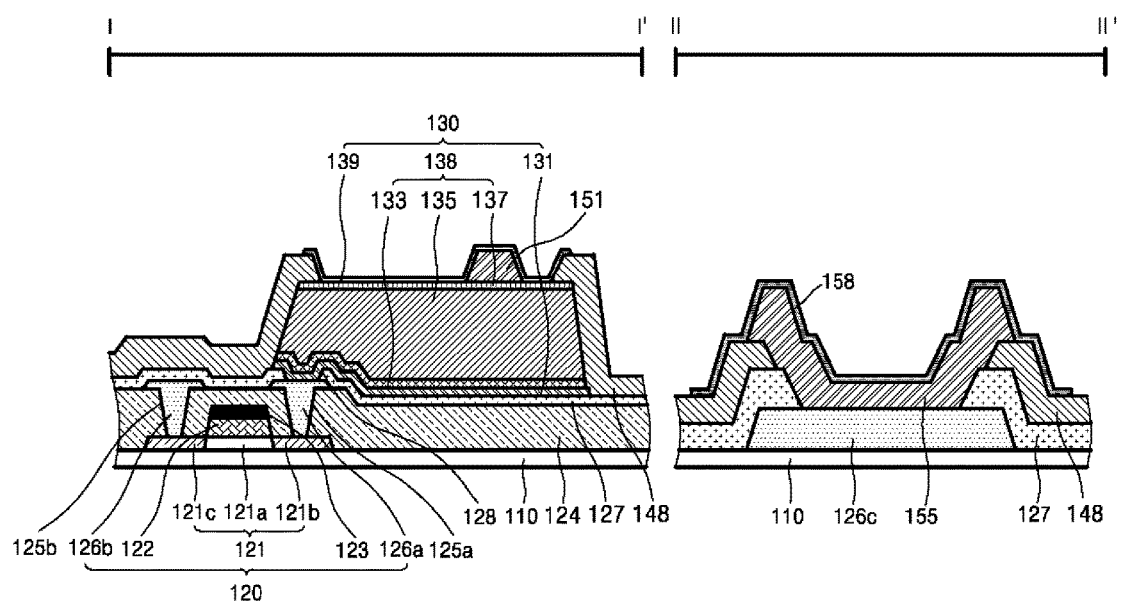

With reference to FIG. 7D, an upper electrode 139 may cover the bias electrode 151 and the PIN layer 138, and the upper electrode 139 may directly contact, not only the bias electrode 151, but also the PIN layer 138 exposed due to absence of the bias electrode 151. For example, a metal anticorrosion layer 158 may be provided over the pad-portion bias electrode 155 of the data pad portion by the same deposition and patterning process by which the upper electrode 139 of the pixel portion may be formed. That is, the upper electrode 139 of the pixel portion and the metal anticorrosion layer 158 of the data pad portion may be simultaneously formed by a single mask process.

A metal anticorrosion layer 158 covering the bias electrode 151 of the data pad portion may be used as a capping layer for reducing or preventing corrosion of the pad-portion bias electrode 155. In the related art, a process for forming the upper electrode 139 of the pixel portion and a process for forming the metal anticorrosion layer 158 of the data pad portion have been carried out by different mask processes, such that it is impossible to acquire satisfactory fabrication efficiency in the related art. That is, the mask used when the metal anticorrosion layer 158 of the data pad portion is formed is not used in the patterning of the pixel portion, and is used only in the patterning of the pad portion in the related art.

In contrast, according to an embodiment of the present disclosure, the metal anticorrosion layer 158 for reducing or preventing metal corrosion of the pad portion and the upper electrode 139 of the pixel portion may be formed of the same ITO material, and the metal anticorrosion layer 158 and the upper electrode 139 may be simultaneously formed by the same mask process using the same material, such that it may be possible to obtain satisfactory fabrication efficiency. Therefore, embodiments of the present disclosure can reduce the number of masks by at least one as compared to the number of masks used in the related art, such that fabrication efficiency can be increased or maximized.

Figure 7E:
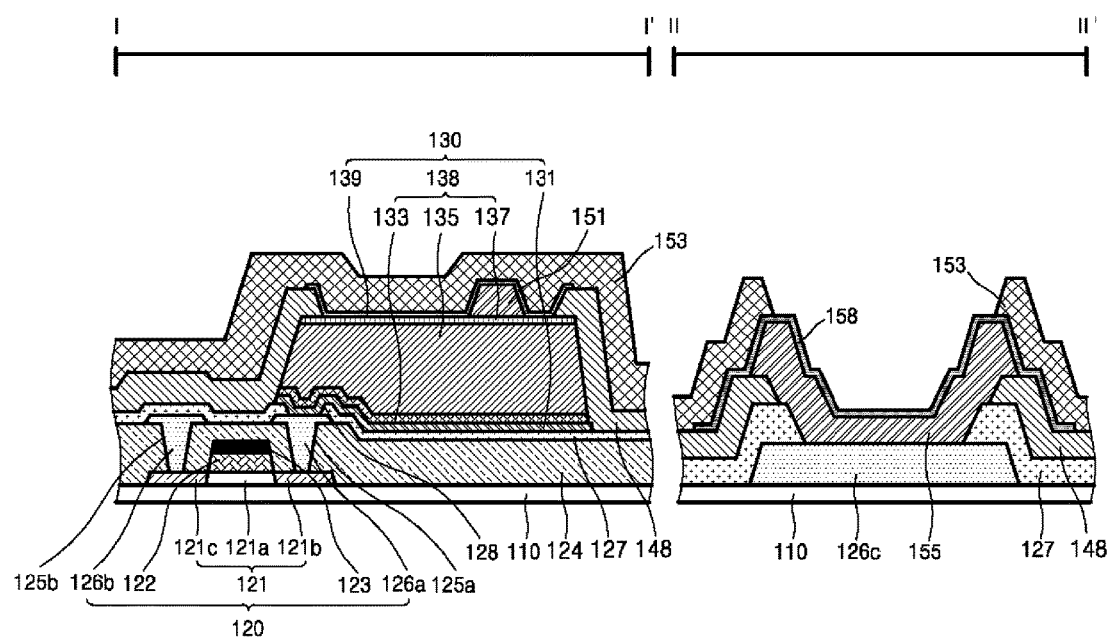

Thereafter, with reference to FIG. 7E, a third protective layer 153 may cover the upper electrode 139 and the thin film transistor 120. Even in the data pad portion, the third protective layer 153 may cover the metal anticorrosion layer 158, and some regions of the metal anticorrosion layer 159 corresponding to the pad-portion source/drain electrode 126c may be exposed and formed.

Figure 8B:
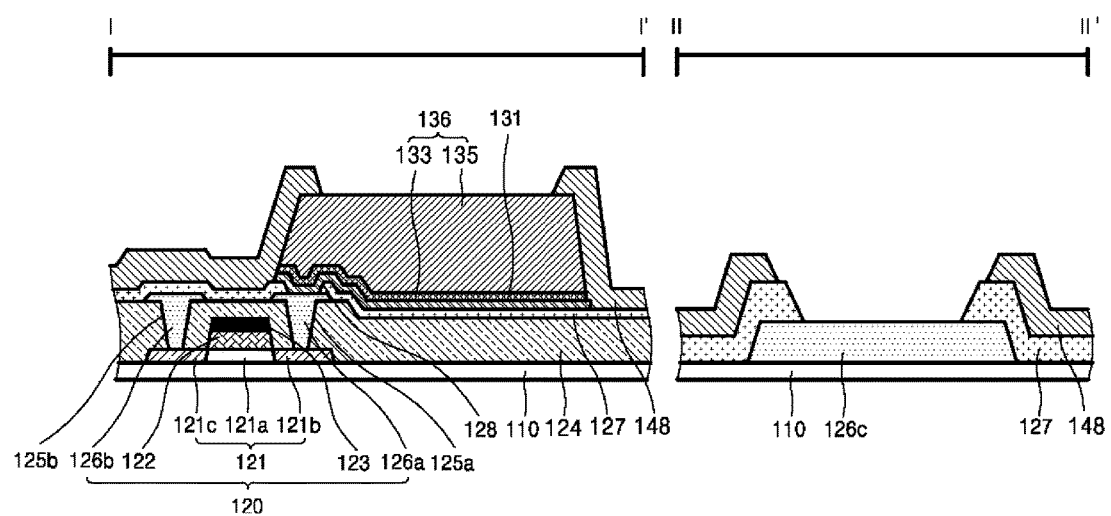

A method for manufacturing the array substrate for the digital X-ray detector according to the second example embodiment of the present disclosure will hereinafter be described with reference to FIGS. 8B to 8E. With reference to FIG. 8B, an N-type semiconductor layer 133 and an intrinsic semiconductor layer 135 may be sequentially stacked over the lower electrode 131, resulting in formation of an IN layer 136. After formation of the IN layer 136, the thin film transistor 120 and the IN layer 136 may be covered with a second protective layer 148, and an upper part of the IN layer 136 may be exposed.

For example, even in the data pad portion, the second protective layer 148 may cover the first protective layer 127, and the second protective layer 148 may expose an upper part of the pad-portion source/drain electrode 126c in a similar manner as in the first protective layer 127. The second protective layer 148 of the pixel portion and the second protective layer 148 of the data pad portion may be formed by the same mask process.

Figure 8C:
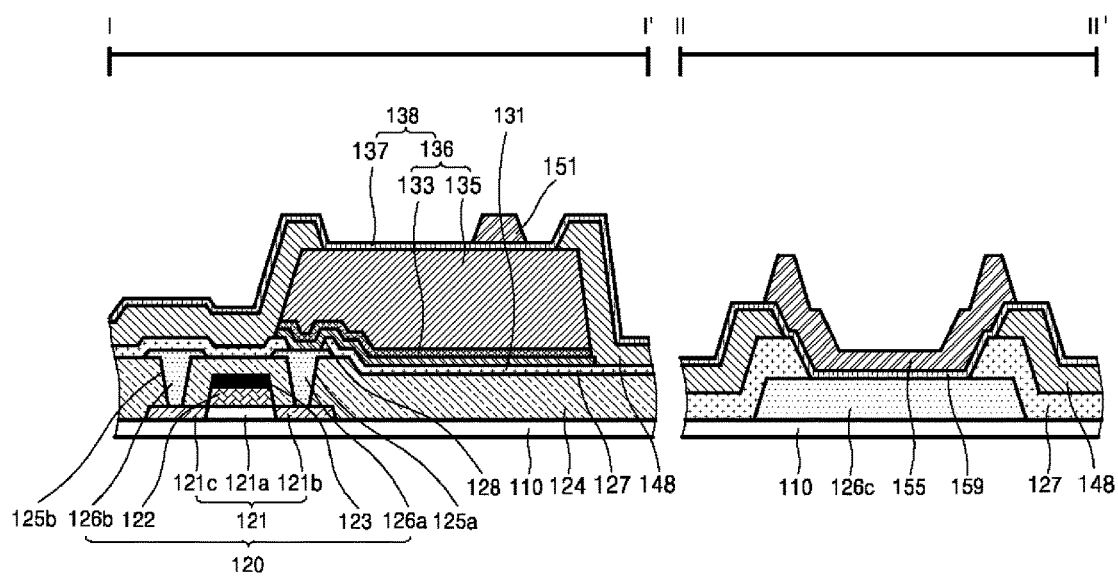

With reference to FIG. 8C, a P-type semiconductor layer 137 may cover the intrinsic semiconductor layer 135 of the IN layer 136. In the fabrication process of FIG. 8C, although a layer for forming the P-type semiconductor layer 137 can be deposited and patterned at the same time, only the deposition process of the above layer may be performed, and the patterning process of the above layer may be performed together with other layers in subsequent processes, as desired.

For example, even in the data pad portion, a pad-portion P-type semiconductor layer 159 may cover the pad-portion source/drain electrode 126c. Even in the P-type semiconductor layer 159 of the data pad portion, although a material for forming the P-type semiconductor layer can be deposited and patterned at the same time during the fabrication process of FIG. 8C, the above material may also be patterned together with other layers in subsequent processes to obtain satisfactory fabrication efficiency.

After deposition of the P-type semiconductor layer 139, a bias electrode 151 may be provided over the PIN layer 138 (e.g., over some regions of the P-type semiconductor layer 137). For example, even in the data pad portion, a pad-portion bias electrode 155 may cover the pad-portion P-type semiconductor layer 159, and the pad-portion P-type semiconductor layer 159 may be formed by the same mask process as in the pixel-portion bias electrode 151.

Figure 8D:
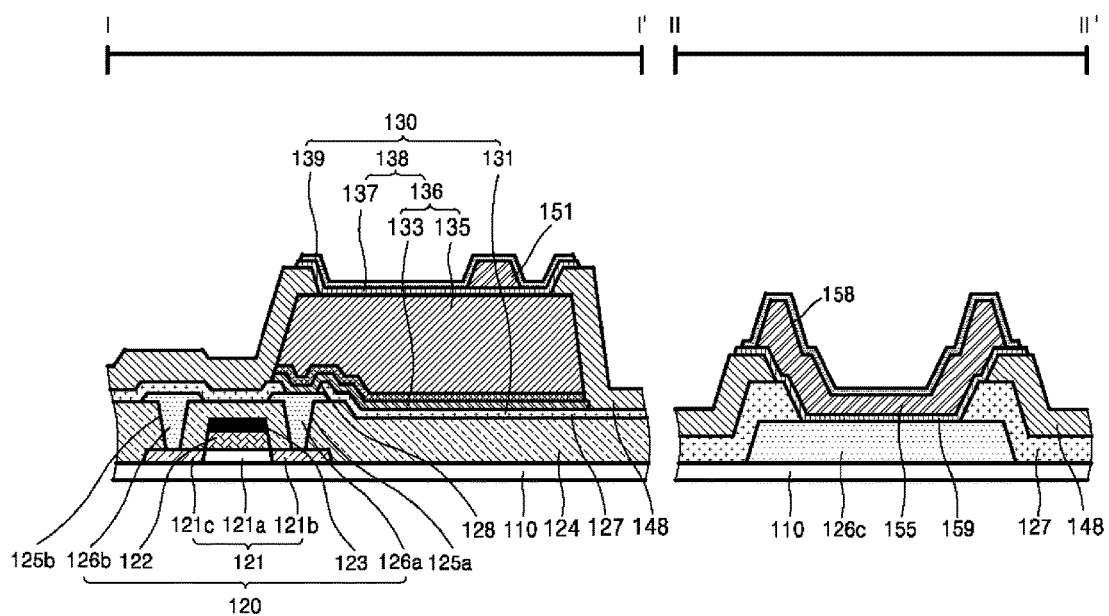
Figure 8E:
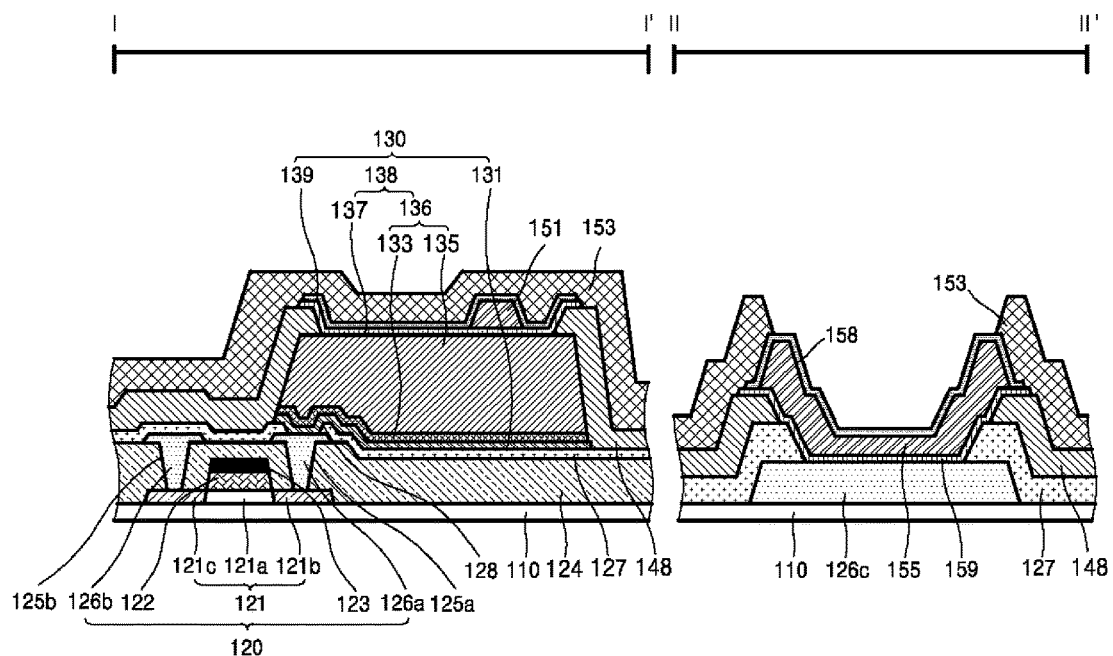

Thereafter, with reference to FIG. 8D, an upper electrode 139 may cover the bias electrode 151 and the PIN layer 138. The upper electrode 139 may directly contact, not only the bias electrode 151, but also the P-type semiconductor layer 137 of the PIN layer 138 exposed due to absence of the bias electrode 151.

After deposition of the upper electrode 139, the upper electrode 139 may be patterned by the patterning process, such that the upper electrode 139 corresponds to a lower electrode. The P-type semiconductor layer 137 may also be formed by the same patterning process as the upper electrode 139. For example, the upper electrode 138 may be formed by wet etching, and the P-type semiconductor layer 137 may be formed by dry etching.

For example, a metal anticorrosion layer 158 may also be formed over the pad-portion bias electrode 155 of the data pad portion by the same deposition and patterning process by which the upper electrode 139 of the pixel portion is formed. That is, the upper electrode 139 of the pixel portion and the metal anticorrosion layer 158 of the data pad portion may be simultaneously formed by a single mask process.

Subsequently, with reference to FIG. 8D, a third protective layer 153 may cover the upper electrode 139 and the thin film transistor 120. Even in the data pad portion, the third protective layer 153 may cover the metal anticorrosion layer 158, and some region (e.g., a portion) of the metal anticorrosion layer 158 corresponding to the pad-portion source/drain electrode 126c may be exposed. In a similar manner as in the first example embodiment of the present disclosure, the second example embodiment of the present disclosure can also reduce the number of masks by at least one as compared to the number of masks used in the related art, such that fabrication efficiency can be increased or maximized.

As is apparent from the above description, the embodiments of the present disclosure can reduce or minimize voltage drop and heat generation by reducing contact resistance between the upper electrode of the PIN diode and the bias electrode. The embodiments of the present disclosure can increase the aperture ratio of the pixel portion by reducing or minimizing the size of a region occupied by the bias electrode.

The embodiments of the present disclosure can further or maximally uniformize a voltage within the upper electrode of the PIN diode. The embodiments of the present disclosure can perform a process for forming an upper electrode over the bias electrode within the pixel portion, and a process for forming a metal anticorrosion layer over the bias electrode in a pad-portion bias electrode within the pad portion using a single mask process, resulting in reduction in the number of masks needed for overall fabrication.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A thin film transistor (TFT) array substrate for a digital X-ray detector, comprising:
   a base substrate;
   a thin film transistor over the base substrate;
   a lower electrode connected to the thin film transistor;
   a positive-intrinsic-negative (PIN) layer over the lower electrode, the PIN layer comprising:
      an N-type semiconductor layer;
      an intrinsic semiconductor layer; and
      a P-type semiconductor layer;
   a bias electrode over the PIN layer;
   an upper electrode covering the PIN layer and the bias electrode; and
   a protective layer between the PIN layer and the upper electrode.

2. The thin film transistor (TFT) array substrate of claim 1, wherein the bias electrode is over a portion of the PIN layer.

3. A digital X-ray detector, comprising:
   a thin film transistor (TFT) array substrate for the digital X-ray detector of claim 2; and
   a scintillator over the array substrate.

4. The thin film transistor (TFT) array substrate of claim 1, wherein:
   the protective layer covers the thin film transistor and the PIN layer; and
   a portion of the protective layer in an upper region of the PIN layer corresponding to the lower electrode is removed.

5. A digital X-ray detector, comprising:
   a thin film transistor (TFT) array substrate for the digital X-ray detector of claim 4; and
   a scintillator over the array substrate.

6. The thin film transistor (TFT) array substrate of claim 1, wherein portions of the protective layer, the bias electrode, and the upper electrode are over a same layer.

7. A digital X-ray detector, comprising:
   a thin film transistor (TFT) array substrate for the digital X-ray detector of claim 6; and
   a scintillator over the array substrate.

8. The thin film transistor (TFT) array substrate of claim 1, wherein the bias electrode corresponding to the upper electrode has a constant width in a plan view.

9. A digital X-ray detector, comprising:
   a thin film transistor (TFT) array substrate for the digital X-ray detector of claim 8; and
   a scintillator over the array substrate.

10. A digital X-ray detector, comprising:
a thin film transistor (TFT) array substrate for the digital X-ray detector of claim 1; and
a scintillator over the array substrate.

11. A thin film transistor (TFT) array substrate for a digital X-ray detector, comprising:
a base substrate;
a thin film transistor over the base substrate;
a lower electrode connected to the thin film transistor;
a positive-intrinsic-negative (PIN) layer over the lower electrode, the PIN layer comprising:
an N-type semiconductor layer;
an intrinsic semiconductor layer; and
a P-type semiconductor layer;
a bias electrode over the PIN layer;
an upper electrode covering the PIN layer and the bias electrode; and
a protective layer between the P-type semiconductor layer and the intrinsic semiconductor layer.

12. The thin film transistor (TFT) array substrate of claim 11, wherein:
the protective layer covers the thin film transistor and the intrinsic semiconductor layer; and
a portion of the protective layer of an upper region of the intrinsic semiconductor layer corresponding to the lower electrode is removed.

13. A digital X-ray detector, comprising:
a thin film transistor (TFT) array substrate for the digital X-ray detector of claim 12; and
a scintillator over the array substrate.

14. The thin film transistor (TFT) array substrate of claim 11, wherein portions of the bias electrode and the upper electrode are over a same layer.

15. A digital X-ray detector, comprising:
a thin film transistor (TFT) array substrate for the digital X-ray detector of claim 14; and
a scintillator over the array substrate.

16. A digital X-ray detector, comprising:
a thin film transistor (TFT) array substrate for the digital X-ray detector of claim 11; and
a scintillator over the array substrate.

17. A method for manufacturing a thin film transistor array substrate for a digital X-ray detector, the method comprising:
providing a thin film transistor over a base substrate;
providing a lower electrode connected to the thin film transistor;
providing a positive-intrinsic-negative (PIN) layer over the lower electrode, the providing the PIN layer comprising stacking:
an N-type semiconductor layer;
an intrinsic semiconductor layer; and
a P-type semiconductor layer;
covering the thin film transistor and the PIN layer with a protective layer, the protective layer exposing an upper region of the PIN layer;
providing a bias electrode over a portion of the exposed PIN layer; and
covering the bias electrode and the PIN layer with an upper electrode.

18. A method for manufacturing a thin film transistor array substrate for a digital X-ray detector, the method comprising:
providing a thin film transistor over a base substrate;
providing a lower electrode connected to the thin film transistor;
providing an intrinsic-negative (IN) layer over the lower electrode, the providing the IN layer comprising stacking:
an N-type semiconductor layer; and
an intrinsic semiconductor layer;
covering the thin film transistor and the IN layer with a protective layer, the protective layer exposing an upper region of the IN layer;
providing a P-type semiconductor layer over the exposed IN layer;
providing a bias electrode over a portion of the P-type semiconductor layer; and
covering the bias electrode and the P-type semiconductor layer with an upper electrode.

* * * * *